(12) United States Patent
Pyo

(10) Patent No.: US 6,723,645 B2
(45) Date of Patent: Apr. 20, 2004

(54) METHOD OF FORMING A METAL WIRING IN A SEMICONDUCTOR DEVICE

(75) Inventor: Sung Gyu Pyo, Ichon-Shi (KR)

(73) Assignee: Hynix Semiconductor Inc, Kyungki-do (KR)

( * ) Notice: Subject to any disclaimer, the term of this patent is extended or adjusted under 35 U.S.C. 154(b) by 32 days.

(21) Appl. No.: 09/875,698

(22) Filed: Jun. 6, 2001

(65) Prior Publication Data

US 2002/0006727 A1 Jan. 17, 2002

(30) Foreign Application Priority Data

Jun. 20, 2000 (KR) ........................................ 2000-33980

(51) Int. Cl.[7] .................. H01L 21/302; H01L 21/3065; H01L 21/311
(52) U.S. Cl. ........................ 438/692; 438/694; 438/700; 438/710; 438/712
(58) Field of Search .............................. 438/692, 694, 438/700, 710, 699; 428/712

(56) References Cited

U.S. PATENT DOCUMENTS

| | | | | |
|---|---|---|---|---|
| RE35,614 E | * | 9/1997 | Norman et al. | 427/250 |
| 5,741,626 A | * | 4/1998 | Jain et al. | 430/314 |
| 6,037,664 A | * | 3/2000 | Zhao et al. | 257/758 |
| 6,040,243 A | * | 3/2000 | Li et al. | 438/687 |
| 6,051,508 A | * | 4/2000 | Takase et al. | 438/724 |
| 6,177,347 B1 | * | 1/2001 | Liu et al. | 438/675 |
| 6,323,121 B1 | * | 11/2001 | Liu et al. | 438/633 |

FOREIGN PATENT DOCUMENTS

| KR | 1998-065748 | 10/1998 |
|---|---|---|
| KR | 2000-0022014 | 4/2000 |

OTHER PUBLICATIONS

Koh et al. "Method of Forming Copper Interconnections and Thin Films Using Chemical Vapor Deposition with Catalyst," Sep. 6, 2001, USPub. No.: US2001/0019891 A1, 18..*
Communication from Korean Intellectual Property Office Dated Mar. 13, 2003 (2 pages).

* cited by examiner

Primary Examiner—Robert Kunemund
Assistant Examiner—Lynette T. Umez-Eronini
(74) Attorney, Agent, or Firm—Marshall, Gerstein & Borun LLP

(57) ABSTRACT

A method of forming a metal wiring in a semiconductor device is disclosed. In order to improve a low deposition speed in the process technology by which a damascene pattern of an ultra-fine structure is filled with copper by CVD method, a CECVD method is disclosed by which a chemical enhancer layer for increasing the deposition speed of copper is formed and the damascene pattern is then filled by means of MOCVD method using a copper precursor which forms a copper wiring. A diffusion prevention film is formed on the sidewall of the damascene pattern in the shape of a spacer in order to prevent an increase of the via resistance by the diffusion of copper into the sidewalls of the damascene pattern. A chemical enhancer layer is selectively formed on a lower metal layer that is exposed by the damascene pattern, thus allowing a selective partial filling of the damascene pattern. Therefore, copper filling in an ultra-fine structure is facilitated which also minimizes the electrical resistivity of the copper wiring.

11 Claims, 1 Drawing Sheet

METHOD OF FORMING A METAL WIRING IN A SEMICONDUCTOR DEVICE

BACKGROUND OF THE INVENTION

1. Technical Field

A method of forming a metal wiring in a semiconductor device is disclosed. More particularly, the disclosure relates to a method of forming a metal wiring in a semiconductor device by which copper can be selectively filled and an increase of the via resistance in the copper wiring can be prevented with a diffusion prevention film. Still more specifically, a chemical enhancer layer is formed and a damascene pattern of an ultra-fine structure is then filled with copper using a copper precursor.

2. Description of the Prior Art

As the integration level of semiconductor devices is increased and its signal transfer speed is lowered, there has been an effort to use copper as a metal wiring for transferring current because copper has a substantially lower resistivity than conventional aluminum and, conversely, copper has good electrical conductivity.

However, copper has a disadvantage that the diffusion speed of copper into a silicon oxide used as an insulating film in a semiconductor device is faster than aluminum. Copper atoms that diffuse into the silicon oxide degrades transistors and capacitors in the semiconductor device and thus increase the leakage current. As a result, a diffusion prevention film for preventing diffusion of copper is required. In a dual damascene structure, however, when a copper wiring is formed, as the diffusion prevention film exists in the bottom of the via contact, it functions to increase the via resistance in the copper wiring. Therefore, if a prevention barrier metal having a low resistivity is not suitably selected, it is thought that the effect of resistance will be great and dishing and erosion may be caused by the difference of a selective ratio with the diffusion barrier film during CMP process.

In addition, due to the rapid higher performance and miniaturization of next-generation semiconductor devices, there is a trend toward forming a copper wiring using CVD. However, filling of copper using the CVD method has problems that the deposition speed is slow and the cost is high.

Recently, there is a growing interest in filling of copper wiring using chemically enhanced chemical vapor deposition (CECVD) method. This method, however, has a problem in that the chemical enhancer must be uniformly sprayed and a selective filling method must be applied by which the chemical enhancer is distributed at a specific location, which is difficult to employ.

SUMMARY OF THE DISCLOSURE

A metal wiring in a semiconductor device is disclosed that is capable of preventing an increase in the via resistance by forming a diffusion prevention film on the sidewall of a damascene pattern in the form of a spacer. The method also facilitates select partial filling of the damascene pattern using a copper precursor by selectively forming a chemical enhancer layer within the damascene pattern using a selective reaction property of the chemical enhancer.

The disclosed method of forming a metal wiring in a semiconductor device is characterized in that it comprises: providing a substrate in which an interlayer insulating film consisted of first, second and third insulating films are formed on a lower metal layer; forming a damascene pattern consisting of a trench and a via on the interlayer insulating film; forming a diffusion prevention film spacer on the sidewall of the trench and the via; selectively forming a chemical enhancer layer on the second insulating film constituting the bottom of the trench and on the lower metal layer constituting the bottom of the via; forming a copper layer by means of chemical vapor deposition method; and performing a hydrogen reduction annealing and a chemical mechanical polishing process to form a copper metal wiring.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF THE PRESENTLY PREFERRED EMBODIMENTS

Figure 1A:
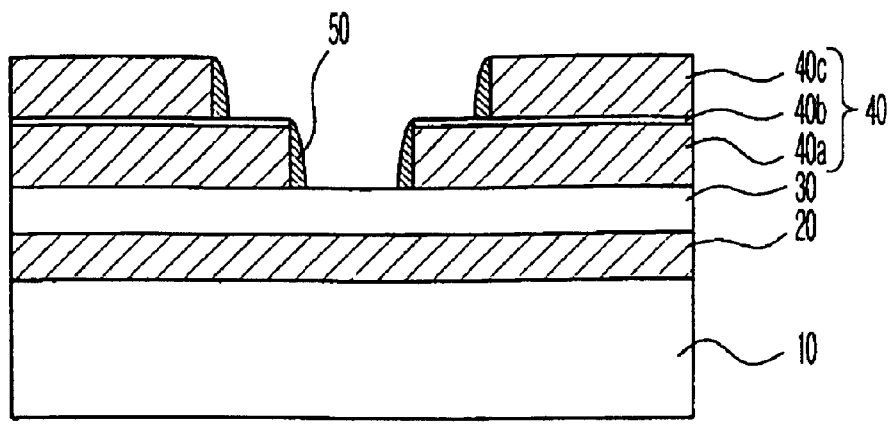
FIGS. 1A through 1C are cross-sectional views sequentially illustrating a method of forming a metal wiring in a semiconductor device.
Figure 1B:
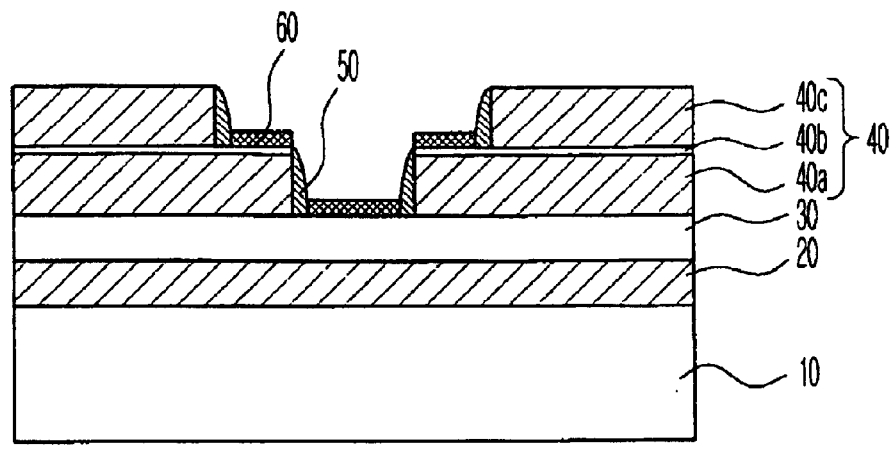
Figure 1C:
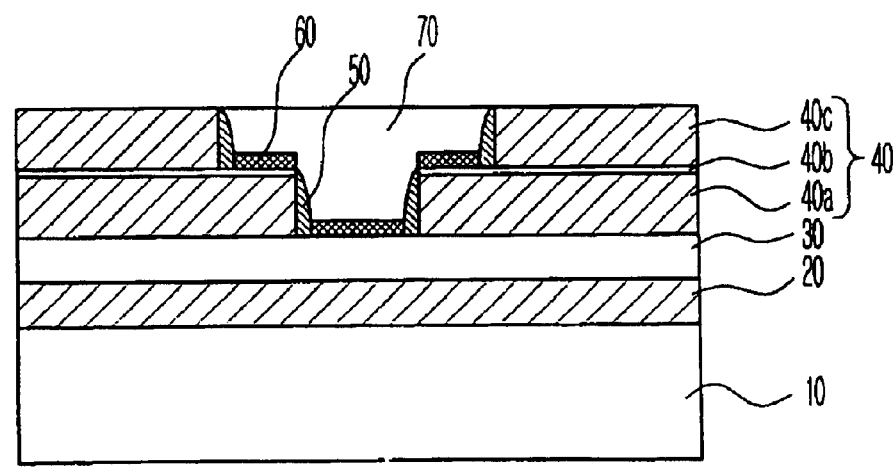

The disclosed method will be described in detail by way of a preferred embodiment with reference to accompanying drawings. Referring now to FIGS. 1A through 1C, a method of forming a metal wiring in a semiconductor device will be below explained in detail.

Referring now to FIG. 1A, a first interlayer insulating film 20, a lower metal layer 30 and a second interlayer insulating film 40 are sequentially formed on a semiconductor substrate 10 in which various components for forming a semiconductor device are also formed. The second interlayer insulating film 40 consists of a first insulating film 40a, a second insulating film 40b and a third insulating film 40c. Of them, the second insulating film 40b comprises a nitride material and serves as an etch prevention film for preventing the first insulating film 40a from being etched upon formation of a trench that is formed during the process of forming a damascene pattern in the second interlayer insulating film 40. Then, a damascene pattern consisting of a trench and a via is formed in the second interlayer insulating film 40 and a cleaning process is then performed to remove an oxide layer left on the surface of the lower metal layer 30 that is exposed by the damascene pattern. Next, a diffusion prevention film is formed having a thickness ranging from about 50 to about 500 Å on the second interlayer insulating film 40 including the exposed lower metal layer 30. The diffusion prevention film is blanket etch processed so that the diffusion prevention film can be remained only at the sidewall of the damascene pattern, thus forming a diffusion prevention film spacer 50.

The first and third insulating films 40a and 40c are formed of oxide materials having a low dielectric constant and the second insulating film 40b is formed from a nitride material. The trench and via formed in the second interlayer insulating film 40 are formed in a double damascene pattern. The cleaning process may employ RF plasma in case that the lower metal layer 30 is made of W, Al, etc. or employ a reactive cleaning method in case that the lower metal layer 30 is made of Cu. The diffusion prevention film may be formed using at least one of ionized PVD TiN, CVD TiN, MOCVD TiN, ionized PVD Ta, ionized PVD TaN, CVD Ta, CVD TaN, CVD WN, CVD TiAlN, CVD TiSiN and CVD TaSiN. The reason by which the diffusion prevention film is formed in the shape of a spacer is that the via resistance is increased by the resistance component of the diffusion prevention film if the diffusion prevention film is formed including the surface of the lower metal layer 30.

In other words, the diffusion prevention film spacer 50 not only sufficiently plays its role to prevent outward diffusion of copper atoms since it covers the first and third insulating films 40a and 40c within the damascene pattern but also can lower the via resistance since the surface of the lower metal layer 30 is exposed. The diffusion prevention film spacer 50 may be formed of a nonconductor such as a silicon nitride (SiN) film or a silicon oxynitride (SiON) film since it does not exist in the bottom of the via.

Referring now to FIG. 1B, a chemical enhancer layer 60 is formed on the entire structure including the lower metal layer 30. The chemical enhancer layer 60 has a selective reaction property in which it rarely reacts with an oxide material and well reacts with a nitride material and a metal. Therefore, the chemical enhancer layer 60 is not formed on the third insulating film 40c made of an oxide material and is formed only on the second insulating film 40b made of a nitride material and the lower metal layer 30, as shown.

The chemical enhancer layer 60 is formed in thickness ranging from about 50 to about 500 Å. Materials for forming the chemical enhancer layer 60 may include one of I (iodine)-containing liquid compounds such as $CH_3I$, $C_2H_5I$, $CD_3I$, $CH_2I_2$ etc., Hhfac½$H_2O$, Hhfac, TMVS, pure $I_2$, I (iodine)-containing gas and water vapor, and is performed at the temperature ranging from about −20 to about 300° C. for a time period ranging from about 1 to about 600 seconds. Also, the materials may include F, Cl, Br, I, At of a liquid state and F, Cl, Br, I, At of a gas state, which are Group VII elements in the Periodic Table.

Referring now to FIG. 1C, a copper layer is formed on the second interlayer insulating film 40 including the damascene pattern by means of metal organic chemical vapor deposition (MOCVD) method using at least one of all the precursors of hfac series such as (hfac)CuVTMOS series, (hfac) CuDMB series, (hfac)CuTMVS series, etc., so that the damascene pattern is filled with copper. As the chemical enhancer layer 60 is formed on the second insulating film 40b and the lower metal layer 30, the speed by which copper is deposited into the damascene pattern is much faster than the speed by which copper is deposited on the third insulating film 40c. Thus, a selective copper deposition into the damascene pattern can be made. The above selective deposition process may be performed in all the deposition equipments having a vaporizer of direct liquid injection (DLI), control evaporation mixer (CEM), orifice scheme and spray scheme. Thereafter, a hydrogen reduction annealing process is performed and the copper layer deposited on the third insulating film 40c is then removed by chemical mechanical polishing (CMP), thus forming a copper wiring 70. Though, the copper layer may be formed on the third insulating film 40c, it is accelerated by the chemical enhancer layer 60. Thus, as the copper layer deposited on the third insulating film 40c is very thin, it can be easily removed by CMP process.

In the above embodiment, it was explained that copper (Cu) is used as a material for forming a metal wiring. However, it should be noted that other metals such as aluminum or tungsten may be used instead.

As mentioned above, the present invention forms a diffusion prevention film in the form of a spacer, forms a chemical enhancer layer selectively within a damascene pattern and then deposits copper to form a wiring. Therefore, the present invention has outstanding effects that it can reduce the via resistance component and thus improve the operating speed and reliability of devices.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of forming a metal wiring in a semiconductor device, the method comprising:
   providing a substrate with a lower metal layer overlying the substrate and an interlayer insulating film comprising first, second and third insulating films formed on the lower metal layer;
   forming a damascene pattern comprising a trench and a via on the interlayer insulating film, a portion of the second insulating film forming a bottom of the trench, a portion of the lower metal layer forming a bottom of the via, the trench and the via each comprising a sidewall;
   forming diffusion prevention film spacers on the sidewalls of the trench and the via;
   selectively forming chemical enhancer layer on the portion of the second insulating film forming the bottom of the trench and on the portion of the lower metal layer forming the bottom of the via;
   forming a copper layer on the diffusion prevention film spacer and chemical enhancer layers by means of chemical vapor deposition method; and
   performing a hydrogen reduction annealing and a chemical mechanical polishing process to form a copper metal wiring from the copper layer.

2. The method of claim 1, wherein the lower metal layer is Al and the method further comprises a cleaning process performed after formation of the damascene pattern, the cleaning process comprising exposing the lower metal layer to a RF plasma.

3. The method of claim 1, wherein the lower metal layer is made of Cu, and the method further comprising a cleaning process performed after formation of the damascene pattern, the cleaning process comprising exposing the lower metal layer to a reactive cleaning.

4. The method of claim 1, wherein the diffusion prevention spacer is formed by forming a diffusion film having a thickness ranging from about 50 to about 500 Å on the entire structure including the damascene pattern and then performing a blanket etch process.

5. The method of claim 1, wherein the diffusion prevention film spacer comprises at least one material selected from the group consisting of ionized PVD TiN, CVD TiN, MOCVD TiN, ionized PVD Ta, ionized PVD TaN, CVD Ta, CVD TaN, CVD WN, CVD TiAlN, CVD TiSiN and CVD TaSiN.

6. The method of claim 1, wherein die diffusion prevention film spacer is formed by using SiN or SiON.

7. The method of claim 1, wherein the chemical enhancer layer is formed in a thickness ranging from about 50 to about 500 Å, using a material, selected from the group consisting of I (iodine)-containing liquid compound, Hhfac½$H_2O$, Hhfac, TMVS, pure $I_0$, I (iodine)-containing gas, and water vapor at a temperature ranging from about −20 to about 300° C. for a time period ranging from about 1 to about 600 seconds.

8. The method of claim 7, wherein the material is an I (iodine)-containing liquid compound selected from the group consisting of $CH_3I$, $C_2H_5I$, $CD_3I$ and $CH_2I_2$.

9. The method of claim 1, wherein the chemical enhancer layer is formed in a thickness ranging from about 50 to about 500 Å, using a material selected from the group consisting of F, Cl, Br, I and At in a liquid state at a temperature ranging from about −20 to about 300° C. for a time period ranging from about 1 to about 600 seconds.

10. The method of claim 1, wherein the chemical enhancer layers are formed in a thickness ranging from about 50 to about 500Å, using a material selected from the group consisting of F, Cl, Br, I and At in a gas state at a temperature ranging from about −20 to about 300° C. for a time period ranging from about 1 to about 600 seconds.

11. The method of claim 1, wherein the copper layer is formed in a deposition apparatus by means of metal organic chemical vapor deposition (MOCVD) method, by using one or more precursors selected from the group consisting of hfac such as (hfac)CuVTMOS series, (hfac)CuDMB series, and (hfac)CuTMVS series.

* * * * *

UNITED STATES PATENT AND TRADEMARK OFFICE
CERTIFICATE OF CORRECTION

PATENT NO. : 6,723,645 B2
DATED : April 20, 2004
INVENTOR(S) : Sung G. Pyo

It is certified that error appears in the above-identified patent and that said Letters Patent is hereby corrected as shown below:

<u>Title page,</u>
Item [75], Inventor, please delete "Ichon-Shi" and replace with -- Kyoungki-do --.

<u>Column 4,</u>
Line 35, please delete "the lower metal layer is A1" and replace with -- the lower metal layer is W or A1 --.
Line 55, please delete "die" and replace with -- the --.

Signed and Sealed this

Thirty-first Day of May, 2005

JON W. DUDAS
*Director of the United States Patent and Trademark Office*